United States Patent
Katsuda et al.

[11] Patent Number: 6,051,303
[45] Date of Patent: Apr. 18, 2000

[54] SEMICONDUCTOR SUPPORTING DEVICE

[75] Inventors: Yuji Katsuda, Tsushima; Kiyoshi Araki, Nagoya; Tsuneaki Ohashi, Ogaki, all of Japan

[73] Assignee: NGK Insulators, Ltd., Japan

[21] Appl. No.: 09/122,894

[22] Filed: Jul. 28, 1998

[30] Foreign Application Priority Data

Aug. 6, 1997 [JP] Japan .................................. 9-211608

[51] Int. Cl.[7] .................................. B32B 3/24; B32B 9/00
[52] U.S. Cl. ........................... 428/138; 428/137; 428/139; 428/140; 428/698; 279/128; 264/647; 264/664; 264/666; 264/668; 118/500; 269/53; 269/329; 501/98.4
[58] Field of Search ....................... 428/137, 138, 428/139, 140, 698; 279/128; 264/647, 664, 666, 668; 118/500; 269/53, 329; 501/98.4

[56] References Cited

U.S. PATENT DOCUMENTS

| | | | |
|---|---|---|---|
| 4,908,173 | 3/1990 | Schwetz et al. | 264/63 |
| 5,320,990 | 6/1994 | Guiton et al. | 501/98 |
| 5,413,360 | 5/1995 | Atari et al. | 279/128 |
| 5,456,815 | 10/1995 | Fukuyo et al. | 204/298.13 |
| 5,520,785 | 5/1996 | Evans et al. | 204/192.27 |
| 5,668,524 | 9/1997 | Aida et al. | 338/308 |
| 5,672,420 | 9/1997 | Stinton et al. | 428/288 |

FOREIGN PATENT DOCUMENTS

| | | |
|---|---|---|
| 5-251365 | 9/1993 | Japan . |
| 7-86379 | 3/1995 | Japan . |
| 7-273053 | 10/1995 | Japan . |
| 9-172054 | 6/1997 | Japan . |

Primary Examiner—William P. Watkins, III
Attorney, Agent, or Firm—Parkhurst & Wendel, L.L.P.

[57] ABSTRACT

A semiconductor-supporting device comprising a substrate made of an aluminum nitride-based ceramic material and having a semiconductor-placing surface, wherein an orientation degree of the aluminum nitride-based ceramic material specified by the following formula is not less than 1.1 and not more than 2.0.

Orientation degree=$[I'(002)/I'(100)]/[I(002)/I(100)]$ in which in an X-ray diffraction measurement, $I'(002)$ is a diffraction intensity of a (002) face of the aluminum nitride-based ceramic material when X-rays are irradiated from the semiconductor-placing surface, $I'(100)$ is a diffraction intensity of a (100) face of the aluminum nitride-based ceramic material when X-rays are irradiated from the semiconductor-placing surface, $I(002)$ is a diffraction intensity of the (002) face of the aluminum nitride ceramic according to a JCPDS Card No. 25-1133, and $I(100)$ is a diffraction intensity of the (100) face of the aluminum nitride ceramic according to a JCPDS Card No. 25-1133.

5 Claims, 1 Drawing Sheet

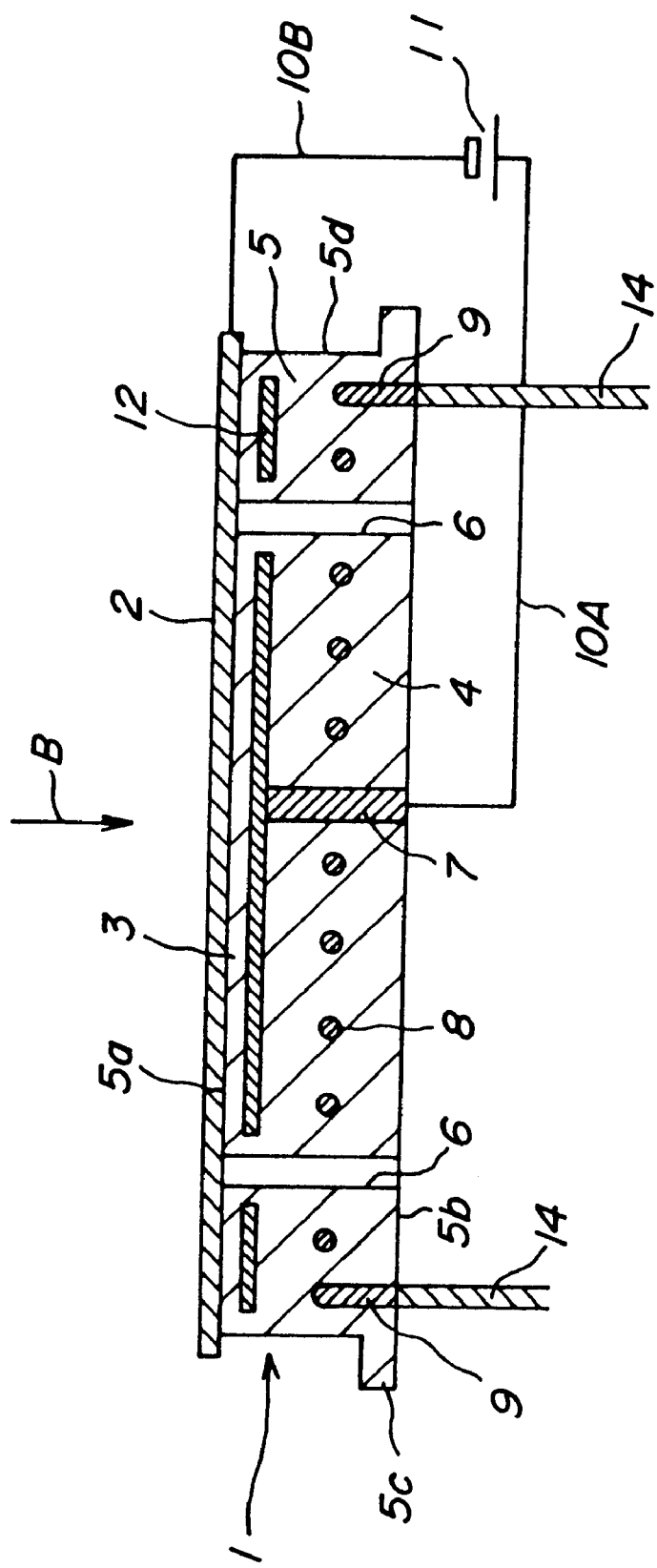

SEMICONDUCTOR SUPPORTING DEVICE

BACKGROUND OF THE INVENTION (1) Field of the Invention

The present invention relates to a semiconductor supporting device for supporting or chucking a semiconductor material such as a semiconductor wafer.

(2) Related Art Statement

An electrostatic chuck is used for chucking and holding a semiconductor wafer in subjecting a semiconductor wafer to transferring, light exposure, film forming such as CVD or sputtering, fine working, cleaning, etching or dicing. Dense ceramics have been noted for substrates for such an electrostatic chuck. Particularly in the semiconductor producing apparatus, a halogen-based corrosive gas such as $ClF_3$ is frequently used as an etching gas or a cleaning gas. Dense aluminum nitride has high corrosion resistance against the above halogen-based corrosive gas. It is known that aluminum nitride is a highly thermal conductive material, and has high thermal shock resistance. Therefore, it is considered that a substrate for the electrostatic chuck of the semiconductor-producing apparatus is favorably made of an aluminum nitride-based ceramic material.

In Japanese patent application No. 4-58727 (filed on Feb. 13, 1992), NGK Insulators, Ltd. disclosed that an aluminum nitride sintered body having a layer of aluminum fluoride on its surface has high corrosion resistance against a plasma of the above halogen-based corrosive gas. That is, even when the aluminum nitride sintered body was exposed to, for example, $ClF_3$ for one hour, its surface state, no change was observed on its surface.

NGK Insulators, Ltd. disclosed that a film of aluminum fluoride is formed on a surface of an aluminum nitride sintered body by a gas phase process such as a CVD process (Japanese patent application Laid-open No. 5-251365). Japanese patent application Laid-open No. 7-273053 discloses that in order to prevent corrosion of the surface of an electrostatic chuck for a semiconductor wafer, the surface of the electrostatic chuck is treated to preliminarily making replacement with fluorine and produce $AlF_3$ at the surface of the electrostatic chuck.

During the course of investigating aluminum nitride as a material for the semiconductor wafer-supporting susceptor such as the electrostatic chuck, the present inventors tackled a study to improve corrosion resistance at a surface region of the susceptor against the halogen-based corrosive gas by changing and controlling anisotoropy of aluminum nitride constituting the susceptor. This study is based on the recognition that particles which would cause a defect of the semiconductor may be generated by fine corrosion of the surface of the susceptor as not having been considered as a problem, with the semiconductor producing process being made finer, and consequently the corroding speed at the surface region of the susceptor is equired to be further decreased.

SUMMARY OF THE INVENTION

An object of the present invention is to provide a semiconductor supporting device comprising a substrate made of an aluminum nitride-based ceramic material and having a semiconductor-placing surface, wherein if the semiconductor supporting device is exposed to the halogen-based corrosive gas, the corroding speed in a surface region of the semiconductor-placing surface is further decreased.

The semiconductor-supporting device according to the present invention comprises a substrate made of an aluminum nitride-based ceramic material and having a semiconductor-placing surface, wherein an orientation degree of the aluminum nitride-based ceramic material specified by the following formula is not less than 1.1 and not more than 2.0.

Orientation degree=[I'(002)/I'(100)]/[I(002)/I(100)]

in which in an X-ray diffraction measurement, I'(002) is a diffraction intensity of a (002) face of the aluminum nitride-based ceramic material when X-rays are irradiated from the semiconductor-placing surface, I'(100) is a diffraction intensity of a (100) face of the aluminum nitride-based ceramic material when X-rays are irradiated from the semiconductor-placing surface, I(002) is a diffraction intensity of the (002) face of the aluminum nitride ceramic according to a JCPDS Card No. 25-1133, and I(100) is a diffraction intensity of the (100) face of the aluminum nitride ceramic according to a JCPDS Card No. 25-1133.

These and other objects, features and effects of the present invention will become apparent from the following description of the invention when taken in conjunction with the attached drawing, with the understanding that some modifications, variations or changes would be easily made by the skilled person in the art to which the invention pertains.

BRIEF DESCRIPTION OF THE DRAWING

For a better understanding of the invention, reference is made to the attached drawing, wherein:

FIG. 1 is a sectional view of schematically showing a susceptor, as one embodiment according to the present invention, for placing a semiconductor wafer on it.

DETAILED DESCRIPTION OF THE INVENTION

Having tackling various new processes for producing aluminum nitride to constitute the susceptor, the present inventors discovered that the corroding speed of the aluminum nitride when exposed to the halogen-based corrosive gas or its plasma is extremely decreased by imparting specific anisotropy between the (100) face and the (002) face in the crystalline lattice constituting aluminum nitride particularly as viewed from the semiconductor-placing surface. The present invention is based on this discovery.

Corrosion resistive ceramic materials generally exhibit ion reactivity against an acidic or alkaline solution, whereas according to the present invention, reactivity against an oxidation or reduction reaction of the halogen gas in the dry gas, not the ionic reactivity, is noted.

As the halogen-based corrosive gas, $ClF_3$ gas, $NF_3$, $CF_4$ gas, $WF_6$ gas, $Cl_2$ gas, $BCl_3$ gas, etc. may be recited.

As the semiconductor supporting device according to the present invention, particularly a susceptor for placing a semiconductor wafer on it is preferred. The present invention can provide the susceptor which is stable against cleaning gas and etching gas and can prevent generation of particles and contamination, possibly causing the defect of the semiconductor, for a long time. This can favorably cope with the production of highly integrated semiconductors such as DRAMs and 4Ms.

As the semiconductor supporting device according to the present invention, a susceptor which is heated with an infrared lamp, recitation may be made of a ceramic heater for heating a semiconductor, a susceptor to be placed at a heating surface of a ceramic heater, a susceptor in which an electrostatically chucking electrode is buried, a susceptor in which an electrostatically chucking electrode and a resistance heating element are buried, a susceptor in which a high frequency plasma-generating electrode is buried, and a susceptor in which a high frequency plasma-generating electrode and a resistance heating element are buried.

In the semiconductor supporting device according to the present invention, a bulky metallic member or particularly a metallic member having a planar bulky shape may be buried in the substrate made of aluminum nitride. Since the metallic member is ordinarily fired simultaneously with firing powdery aluminum nitride, the metallic member is preferably made of a high melting point metal. As the high melting point metal, tantalum, tungsten, molybdenum, platinum, rhenium, hafnium and an alloy of any of them may be recited. From the standpoint of preventing the contamination of the semiconductor, tantalum, tungsten, molybdenum, platinum and an alloy of any of them are preferred.

As the planar bulky member, the following may be recited.

(1) A planar bulky member made of a thin plate
(2) A bulky member made of a planar electrode in which a number of small voids are formed. The bulky member may be made of a planer body aving a number of small apertures as well as a network member. As the planar member having a number of small holes, a punched metal may be recited.

FIG. 1 is a sectional view for schematically showing one embodiment of an electrostatic chuck 1 with a heater as one embodiment of the semiconductor device. A ring-shaped flange 5c is provided at a peripheral face 5d of an almost discoidal substrate 5, and an electrostatically chucking electrode 12 is buried inside the substrate 5. At a side of a surface 5a of the substrate for placing a semiconductor wafer 2 on it is formed a dielectric layer 3 having a given thickness. A terminal 7 is buried at a side of a supporting portion 4 of the substrate 5. In given locations of the substrate 5 are formed holes 6 for passing pins to move up and down the semiconductor wafer 2.

A DC electric power source 11 is connected to the terminal 7 via an electric wire 10A, and a negative pole of the DC electric power source 11 is connected to the semiconductor wafer 2 via an electric wire 10B. A resistance heating element 8 is buried in the substrate 5 between the electrostatically chucking electrode 12 and the rear face 5b. Terminals 9 are connected to opposite ends of the resistance heating element 8, respectively, and also connected to exterior terminals 14, respectively. The resistance heating element 8 is to heat the semiconductor wafer 2 which is being chucked onto the susceptor, and may be optically provided, although the heating element is not necessarily indispensable.

X rays are irradiated onto the susceptor from a direction of an arrow B. and the diffraction intensity of the reflected rays is measured. I'(002) is a diffraction intensity of a (002) face of the aluminum nitride-based ceramic material at that time, and I'(100) is a diffraction intensity of a (100) face of the aluminum nitride-based ceramic material. A ratio of I'(002)/I'(100) is divided by that of I(002)/I(100) in which I(002) and I(100) are diffraction intensities of the (002) face and the (100) of the aluminum nitride ceramic material (substantially non-oriented) according to the JCPDS Card No. 25-1133, thereby obtaining an orientation degree of the semiconductor supporting device.

In order to produce the semiconductor supporting device according to the present invention, for example, the following process may be used. First, a aluminum nitride starting material having a high purity is preferably used. More specifically, the content of metallic impurities excluding rare earth elements is preferably not more than 500 ppm, more preferably not more than 100 ppm.

Alumina may be incoporated into the aluminum nitride starting material. The content of alumina is preferably 1.0 to 10 wt % relative to the entire starting material. A rare earth element(s) is (are) incorporated into the aluminum nitride starting material in various forms. As the rare earth elements, Y, Yb, Ce, Pr and Eu are particularly preferred. The addition amount of the rare earth element is preferably 0.1 to 1.0 wt % as calculated in the form of its oxide. In this range, the orientation degree is increased.

A rare earth element alone or its powdery compound may be added into the powdery aluminum nitride starting material. In general, an oxide of the rare earth element is most readily available. However, a ompound of a rare earth element, such as a nitrate, a sulfate or an alkoxide, s dissolved into an appropriate solvent into which such a compound is soluble, the resulting solution is added to the aluminum nitride powdery starting material.

If a dry pressing method is used, it may be proposed that the powdery starting material is dried by spray drying. This is particularly preferable as an instant drying method for the rare earth element compound added in a very small amount.

In the formulating step, it may be that the aluminum nitride powdery starting material is dispersed in a solvent, and the rare earth element compound and/or alumina is added, in the form of a powdery oxide or a solution as mentioned above, to the resulting dispersion. The mixture may be mixed by simple stirring, and a mixing mill such as a pot mill, a trommel or an attrition mill may be used, if an aggregate in the starting material powder needs to be milled.

A milling solvent is preferably dried off by spray drying. It is preferable to adjust the grain size of the dried powder through a sieve after vacuum drying.

In a step of molding the powder, a molded body having a discoid shape can be produced by using a mold pressing method. The molding pressure is preferably not less than 100 kgf/cm$^2$.

Then, the molded body is fired by hot press. It is necessary to set the pressure of hot press at not less than 200 kgf/cm$^2$ in a temperature range between 1400° C. at which aluminum nitride begins to sinter and the maximum temperature in the sintering step during a course of rising the temperature, whereas it is necessary to set the pressure at not less than 200 kgf/cm$^2$ in a temperature range from the maximum temperature in the sintering step to 1400° C. during a course of descending the temperature. The above pressure is preferably not less than 250 kgf/cm$^2$. Although the upper limit is not specifically limited, it is practically preferably not more than 1000 kgf/cm$^2$ in order to prevent damages of ceramic tools such as the mold. It is preferable that the atmosphere is kept under vacuum in a temperature range of room temperature to 1400° C., whereas a gas is introduced in the temperature range not less than 1400° C.

At the same time, the heating rate is set at not more than 250° C./hour in the temperature range from 1400° C. at which aluminum nitride begins to sinter to the maximum temperature in the sintering step. This heating rate is preferably not less than 50° C. The maximum temperature is preferably 1700° C. to 2300° C.

In the following, more concrete experimental results will be explained.

(Production of susceptor substrates in Examples 1–5 and Comparative Examples 1–3)

Each of the susceptor substrates was produced in the following way. More specifically, powdery aluminum nitride obtained by a reduction nitriding method was used as a starting material powder. An additive solution was produced by dissolving a nitrate of yttrium into isopropyl alcohol. The additive solution was mixed into the aluminum nitride powdery starting material by using a pot mill. The mixing rate of yttrium as calculated in the form of $Y_2O_3$ was 0.1 wt %. At that time, powdery alumina was added in an amount of 3.0 wt %.

A discoid molded body having a diameter of 200 mm was produced by uniaxially molding the resulting mixture under pressure of 200 kgf/cm$^2$. The discoid molded body was placed in a hot press mold, and sealed therein. The temperature was raised at a heating rate of 300° C., while evacuation was being effected in a temperature range from room temperature to 1400° C., and nitrogen gas was introduced at 5 kgf/cm$^2$ after the temperature reached 1400° C.

The pressure at that time was 200 kgf/cm$^2$ for Example 1, 250 kgf/cm$^2$ for Example 2, 300 kgf/cm$^2$ for Example 3, 400 kgf/cm$^2$ for Example 4, 500 kgf/cm$^2$ for Example 5, 0 kgf/cm$^2$ for Comparative Example 1, 50 kgf/cm$^2$ for Comparative Example 2, and 100 kgf/cm$^2$ for Comparative Example 3.

After the point of time at which the temperature reached 1400° C., the heating rate was decreased to 100° C./hour, and heating was effected up to 1900° C. After the molded body was held at 1900° C. for 5 hours, the sintered body was cooled down to 1400° C. at the cooling rate of 100° C. and further cooled down to room temperature at 300° C./hour.

With respect to each of the thus obtained discoid substrates made of the aluminum nitride sintered bodies, the above-mentioned orientation degree was measured. Results are shown in Table 1.

(Production of a substrate in Comparative Example 4)
In Comparative Example 4, a film of aluminum nitride was ormed on a surface of a substrate made of a commercially available sintered ody of aluminum nitride. The forming condition was: temperature of 850° C., a reaction gas of 250 ml/min.$NH_3$ and 150 ml/min HCl, 1000 ml/min. hydrogen gas as an $AlCl_3$ carrier, and pressure of 10 mbar.

(Production of substrates in Examples 6 to 8)
Susceptor substrates in Examples 6 to 8 according to the present invention were produced in the same manner as in Examples 1 to 5, provided that no yttrium was added and the pressure was 250 kgf/cm$^2$ in Example 6; the addition amount of yttrium as calculated as $Y_2O_3$ was 1.0 wt % and the pressure was 250 kgf/cm$^2$ in Example 7; and $Y_2O_3$ was 5.0 wt % and the pressure was 250 kgf/cm$^2$ in Example 8.

(Corrosion Test)
The thus obtained substrates for susceptors were subjected to a corrosion test. More specifically, each substrate was held in 600° C. $NF_3$ gas excited in an induction coupled plasma under 1 torr. for 10 hours. The flow rate of the gas was 100 sccm, and the gas was excited under 13.56 MHz and 500 W. With respect to each substrate, the weight was measured before and after the reaction, and is shown in Table 1, using a unit of mg/cm$^2$.

TABLE 1

|  | Added amount of $Y_2O_3$ (calculated) (wt %) | Orientation degree | Corrosion weight loss (mg/cm$^2$) |
| --- | --- | --- | --- |
| Example 1 | 0.1 | 1.17 | 0.6 |
| Example 2 | 0.1 | 1.31 | 0.3 |
| Example 3 | 0.1 | 1.45 | 0.3 |
| Example 4 | 0.1 | 1.51 | 0.2 |
| Example 5 | 0.1 | 1.53 | 0.2 |

TABLE 1-continued

|  | Added amount of $Y_2O_3$ (calculated) (wt %) | Orientation degree | Corrosion weight loss (mg/cm$^2$) |
| --- | --- | --- | --- |
| Comparative Example 1 | 0.1 | 1.02 | 1.7 |
| Comparative Example 2 | 0.1 | 1.04 | 1.6 |
| Comparative Example 3 | 0.1 | 1.07 | 1.1 |
| Comparative Example 4 | 0.0 | 2.35 | 2.1 |
| Example 6 | 0.0 | 1.42 | 0.2 |
| Example 7 | 1.0 | 1.22 | 0.4 |
| Example 8 | 5.0 | 1.11 | 0.6 |

As is seen from the above results, it was clarired that when the orientation degree was set at not more than 1.1 and not more than 2.0, the corroding speed was remarkably decreased. Further, it was also clarified that when the orientation degree was set at not less than 1.3 and not more than 1.7, the corrosion weight loss was remarkably decreased to 0.3 mg/cm$^2$, whereas when the orientation degree was set at not less than 1.4 and not more than 1.6, the corroding speed was remarkably decreased to 0.2 mg/cm$^2$. It is surprising that the corrosion resistance was largely improved as above, when the substrates in Examples 1–8 and Comparative Examples 1–3 were made of the same material.

When Examples 2, 6, 7 and 8 are compared with one another, it is clarified that the smaller the addition amount of yttria, the greater is the orientation degree, provided that the pressing pressure is equal.

In Comparative Example 4, when a chemical vapor deposition film was formed on the substrate, its orientation degree was measured to be as large as over 2. However, although the dense film was formed on the substrate by the chemical vapor deposition process, the corrosion speed was conspicuously larger as compared with the invention Examples.

The reason why the thus remarkable function and effects were obtained is not clear. However, the orientation of the particles constituting it is considered that the aluminum nitride sintered body and the hardness of its surface have some effect of resisting the halogen-based corrosive gas.

As having been mentioned above, according to the present invention, if the semiconductor-supporting device provided with the substrate made of the aluminum nitride-based ceramic material is exposed to the halogen-based corrosive gas, the corroding speed at the surface region of the semiconductor-placing surface can be further decreased.

What is claimed is:

1. A semiconductor-supporting device comprising a substrate made of an aluminum nitride-based ceramic material and having a semiconductor-placing surface, wherein an orientation degree of the aluminum nitride-based ceramic material specified by the following formula is not less than 1.1 and not more than 2.0.

Orientation degree=$[I'(002)/I'(100)]/[I(002)/I(100)]$ in which in an X-ray diffraction measurement, $I'(002)$ is a diffraction intensity of a (002) face of the aluminum nitride-based ceramic material when X-rays are irradiated from the semiconductor-placing surface, $I'(100)$ is a diffraction intensity of a (100) face of the aluminum nitride-based ceramic material when X-rays are irradiated from the semiconductor-placing surface, $I(002)$ is a diffraction intensity of the (002) face of the aluminum nitride ceramic according to a JCPDS Card No. 25-1133, and $I(100)$ is a diffraction intensity of the (100) face of the aluminum nitride ceramic according to a JCPDS Card No. 25-1133.

2. The semiconductor-supporting device set forth in claim 1, wherein the orientation degree is not less than 1.3 to not more than 1.7.

3. The semiconductor-supporting device set forth in claim 1, further comprising a bulk conductive metallic member buried in the substrate.

4. The semiconductor-supporting device set forth in claim 3, wherein the bulk conductive metallic member is a high melting metal selected from the group consisting of tantalum, tungsten, molybdenum, platinum, rhenium, hafnium and an alloy of any of them.

5. The semiconductor-supporting device set forth in claim 3, wherein the bulk conductive metal member is in the form of a thin plate or a planar plate having numerous small through apertures.

* * * * *